(12) United States Patent
Lee

(10) Patent No.: US 12,010,839 B2
(45) Date of Patent: *Jun. 11, 2024

(54) SEMICONDUCTOR DEVICE INCLUDING CONTACT STRUCTURE AND METHOD OF MANUFACTURING SEMICONDUCTOR DEVICE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/970,360

(22) Filed: Oct. 20, 2022

(65) Prior Publication Data

US 2023/0045057 A1 Feb. 9, 2023

Related U.S. Application Data

(63) Continuation of application No. 16/775,186, filed on Jan. 28, 2020, now Pat. No. 11,508,740.

(30) Foreign Application Priority Data

Jul. 24, 2019 (KR) .................. 10-2019-0089880

(51) Int. Cl.
*H10B 41/41* (2023.01)
*H01L 23/535* (2006.01)
(Continued)

(52) U.S. Cl.
CPC ........... *H10B 41/41* (2023.02); *H01L 23/535* (2013.01); *H01L 29/41725* (2013.01);
(Continued)

(58) Field of Classification Search
CPC ........ H10B 41/41; H10B 20/60; H10B 43/40; H10B 41/10; H10B 43/10; H10B 43/27; H10B 43/35; H10B 43/20; H10B 41/35; H10B 41/20; H01L 23/535; H01L 29/41725; H01L 23/5226; H01L 23/528;
(Continued)

(56) References Cited

U.S. PATENT DOCUMENTS

2008/0311718 A1* 12/2008 Futase ............... H01L 21/28556
438/296
2018/0308559 A1 10/2018 Kim et al.
(Continued)

FOREIGN PATENT DOCUMENTS

CN 108695335 A 10/2018
CN 109216366 A 1/2019
(Continued)

*Primary Examiner* — Duy T Nguyen
(74) *Attorney, Agent, or Firm* — WILLIAM PARK & ASSOCIATES LTD.

(57) ABSTRACT

A semiconductor device may include a plurality of first contact structures, plug-shaped second contact structures configured to be connected to a first number of the plurality of first contact structures, respectively, a slit-shaped second contact structure configured to be connected to a second number of the plurality of first contact structures, adjacent in a first direction, and a third contact structure configured to be connected to sidewalls of the plug-shaped second contact structures, adjacent in the first direction.

15 Claims, 17 Drawing Sheets

(51) Int. Cl.
*H01L 29/417* (2006.01)
*H10B 20/00* (2023.01)
*H10B 41/10* (2023.01)
*H10B 43/10* (2023.01)
*H10B 43/40* (2023.01)
*G11C 16/04* (2006.01)

(52) U.S. Cl.
CPC ............. *H10B 20/60* (2023.02); *H10B 43/40* (2023.02); *G11C 16/0483* (2013.01); *H10B 41/10* (2023.02); *H10B 43/10* (2023.02)

(58) Field of Classification Search
CPC ......... H01L 21/76895; H01L 21/76897; H01L 29/66825; H01L 29/788; G11C 16/0483
USPC ........................................................ 438/128
See application file for complete search history.

(56) References Cited

U.S. PATENT DOCUMENTS

| | | | |
|---|---|---|---|
| 2019/0013237 A1 | 1/2019 | Nam et al. |
| 2019/0035733 A1 | 1/2019 | Park |
| 2019/0067182 A1 | 2/2019 | Lee et al. |
| 2019/0333931 A1 | 10/2019 | Jung et al. |
| 2020/0027892 A1 | 1/2020 | Zhu et al. |

FOREIGN PATENT DOCUMENTS

| | | |
|---|---|---|
| CN | 109314116 A | 2/2019 |
| KR | 1020080002057 A | 1/2008 |
| KR | 1020100057203 A | 5/2010 |
| KR | 1020190024579 A | 3/2019 |
| KR | 1020190125811 A | 11/2019 |

\* cited by examiner

D - D'

E - E'

F - F'

SEMICONDUCTOR DEVICE INCLUDING CONTACT STRUCTURE AND METHOD OF MANUFACTURING SEMICONDUCTOR DEVICE

CROSS-REFERENCE TO RELATED APPLICATION

The present application is a continuation application of U.S. patent application Ser. No. 16/775,186, filed on Jan. 28, 2020, issued as U.S. Pat. No. 11,508,740 on Nov. 22, 2022, and claims priority under 35 U.S.C. § 119(a) to Korean. patent application number 10-2019-0089880, filed on Jul. 24, 2019, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the same.

2. Related Art

A non-volatile memory element is a memory element in which stored data is maintained even when the power supply is cut off. As integration improvements have been made with regard to a two-dimensional non-volatile memory element that forms a memory cell in a single layer on a substrate has reached a limit, a three-dimensional non-volatile memory element that vertically stacks memory cells on a substrate has been proposed.

The three-dimensional non-volatile memory element includes interlayer insulating films and gate electrodes which are alternately stacked, and channel films passing through the interlayer insulating films and the gate electrodes, and memory cells that are stacked along the channel films. Various structures and manufacturing methods have been developed to improve operation reliability of the non-volatile memory element having such a three-dimensional structure.

SUMMARY

A semiconductor device according to an embodiment of the present disclosure may include a plurality of first contact structures, plug-shaped second contact structures configured to be connected to a first number of the plurality of first contact structures, respectively, a slit-shaped second contact structure configured to be connected to a second number of the plurality of first contact structures, adjacent in a first direction, and a third contact structure configured to be connected to sidewalls of the plug-shaped second contact structures, adjacent in the first direction.

A semiconductor device according to an embodiment of the present disclosure may include a first interlayer insulating film, a plurality of first contact structures configured to pass through the first interlayer insulating film, an etch stop film on the first interlayer insulating film, a second interlayer insulating film on the etch stop film, plug-shaped second contact structures configured to pass through the etch stop film and the second interlayer insulating film and configured to be connected to a first number of the plurality of first contact structures, respectively, a slit-shaped second contact structure configured to pass through the etch stop film and the second interlayer insulating film, configured to be connected to a second number of the plurality of first contact structures, and configured to extend in the first direction, and a third contact structure configured to pass through the second interlayer insulating film, configured to be connected to sidewalls of the plug-shaped second contact structures, and configured to extend in the first direction.

A method of manufacturing a semiconductor device according to an embodiment of the present disclosure may include forming a plurality of first contact structures, forming plug-shaped second contact structures connected to a first number of the plurality of first contact structures, respectively, forming a slit-shaped second contact structure to be connected to a second number of the plurality of first contact structures, adjacent to the first contact structures, in a first direction, extending in the first direction, and forming a third contact structure to be connected to sidewalls of the plug-shaped second contact structures, extending in the first direction.

A method of manufacturing a semiconductor device according to an embodiment of the present disclosure may include forming a plurality of first contact structures to pass through the first interlayer insulating film, forming an etch stop film on the first interlayer insulating film, forming a second interlayer insulating film on the etch stop film, forming plug-shaped second contact structures to pass through the etch stop film and the second interlayer insulating film and connected to a first number of the plurality of first contact structures, respectively, forming a slit-shaped second contact structure to pass through the etch stop film and the second interlayer insulating film, to be connected to a second number of the plurality of first contact structures, and to extend in the first direction, and forming a third contact structure to pass through the second interlayer insulating film, to be connected to sidewalls of the plug-shaped second contact structures, and to extend in the first direction.

DETAILED DESCRIPTION

Figure 1:
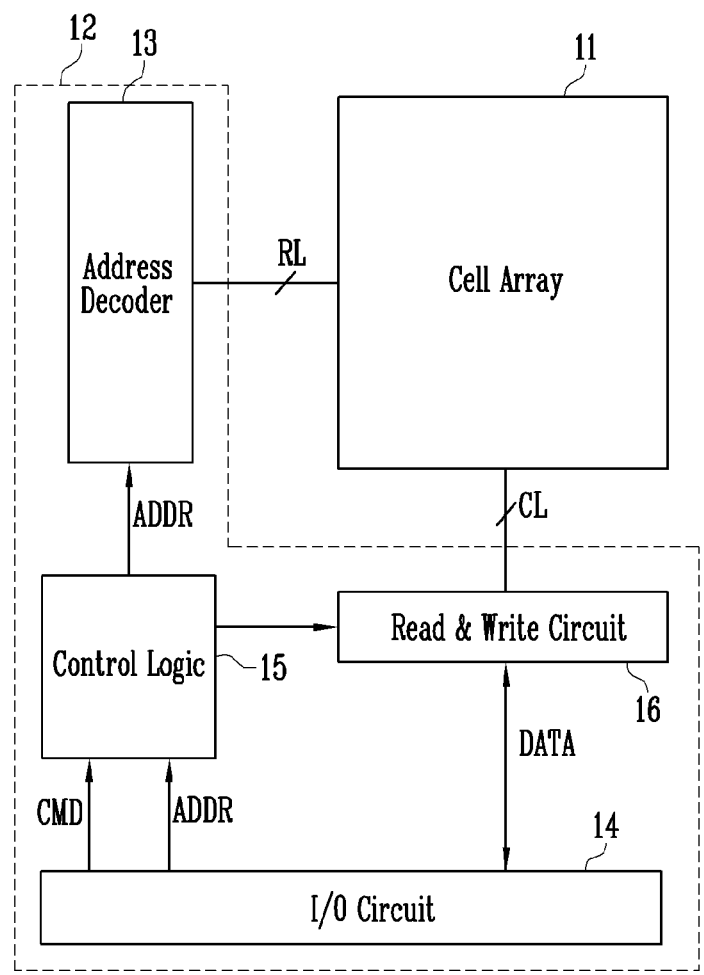
FIG. 1 is a block diagram, illustrating a configuration of a semiconductor device, according to an embodiment of the present disclosure.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first" "second" and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

An embodiment of the present disclosure provides a semiconductor device having an easy manufacturing process, a stable structure, and an improved characteristic, and a method of manufacturing the semiconductor device.

A semiconductor device having a stable structure and improved reliability may be provided. In addition, in manufacturing a semiconductor device, difficulty of a process may be reduced, a procedure may be simplified, and cost may be reduced.

FIG. 1 is a block diagram, illustrating a configuration of a semiconductor device, according to an embodiment of the present disclosure. Referring to FIG. 1, the semiconductor device 10 may include a cell array 11 and a peripheral circuit 12.

The cell array 11 may be connected to an address decoder 13 through row lines RL and may be connected to a read and write circuit 16 through column lines CL. Here, the row lines RL may be a word line and the column lines CL may be a bit line. However, the word lines and the bit lines are relative concepts, and the row lines may be the bit line and the column lines may be the word line.

The cell array 11 may include a plurality of memory strings, and the memory strings may be arranged in a horizontal direction or a vertical direction on a substrate. In addition, the cell array 11 may include a plurality of memory blocks, and each of the memory blocks may include a plurality of pages. For example, the semiconductor device 10 performs an erase operation in a memory block unit, and performs a program operation or a read operation in a page unit.

The peripheral circuit 12 may include the address decoder 13, the read and write circuit 16, an input/output circuit 14, and a control logic 15.

The control logic 15 may be connected to the address decoder 13, the read and write circuit 16, and the input/output circuit 14. The control logic 15 may receive a command CMD and an address ADDR from the input/output circuit 14 and may control the address decoder 13 and the read and write circuit 16 to perform internal operations based on the received command CMD.

The address decoder 13 may be connected to the cell array 11 through the row lines RL. For example, the address decoder 13 may be connected to the cell array 11 through a word line, a source select line, and a drain select line. In addition, the address decoder 13 may be configured to control the row lines RL in response to control of the control logic 15. Therefore, the address decoder 13 may receive the address ADDR from the control logic 15, and may select any one of the memory blocks of the cell array 11 based on the received address ADDR.

The program operation and the read operation of the semiconductor device 10 may be performed in a page unit. Therefore, during the program operation and the read operation, the address ADDR may include a block address and a row address. The address decoder 13 may decode a block address of the received address ADDR and select one memory block based on the decoded block address. The address decoder 13 may decode a row address of the received address ADDR and select any one page of the selected memory block based on the decoded row address.

The erase operation of the semiconductor device 10 may be performed in a memory block unit. Therefore, during the erase operation, the address ADDR may include a block address. The address decoder 13 may decode the block address and select one memory block based on the decoded block address.

The read and rite circuit 16 is connected to the cell array 11 through the column lines CL. The read and write circuit 16 may include at least one page buffer. For example, the column lines CL may be connected to the page buffers, respectively. During the program operation, the read and write circuit 16 transfers data DATA received from the input/output circuit 14 to the column lines CL, and the memory cells of the selected page are programmed based on the transferred data DATA. Here, the data DATA may be multi-bit data to be programmed in memory cells, respectively. During the read operation, the read and write circuit 16 reads the data DATA from the memory cells of the selected page through the column lines CL and outputs the read data DATA to the input/output circuit 14. During the erase operation, the read and write circuit 16 may float the column lines CL, For reference, the program operation and the erase operation may include a verify operation, and the verify operation may be performed in a manner similar to that of the read operation.

Figure 2:
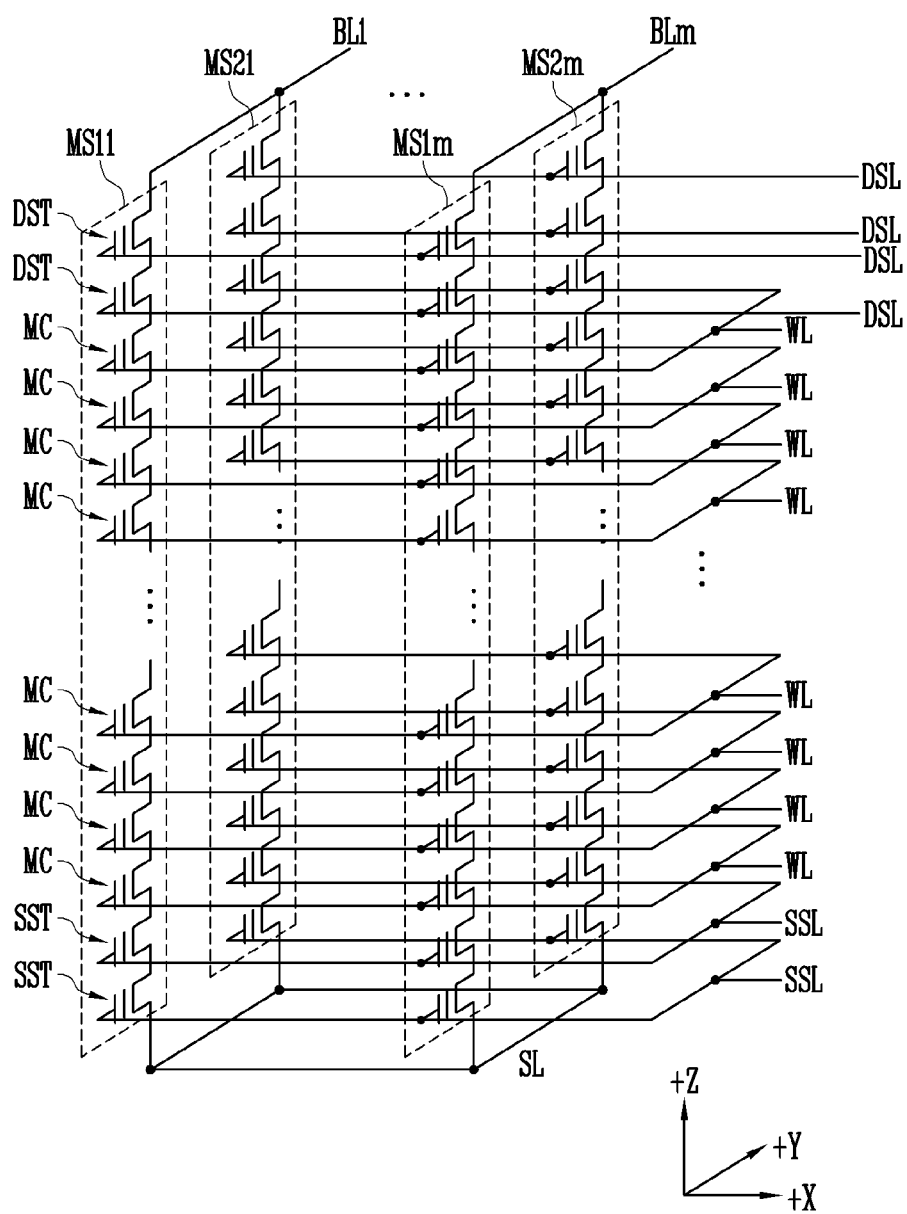
FIG. 2 is a circuit diagram of a cell array according to an embodiment of the present disclosure.

FIG. 2 is a circuit diagram of a cell array according to an embodiment of the present disclosure. The cell array may include a plurality of memory blocks BLK, and each memory block BLK may include memory cells MC arranged in a three dimension.

Referring to FIG. 2, the memory block BLK may include a plurality of memory strings MS11 to MS1m and MS21 to MS2m, connected between bit lines BL1 to BLm and the source line SL, Each of the memory strings MS11 to MS1m and MS21 to MS2m extends along a +Z direction. Here, the +Z direction may be a direction in which the memory cells MC are stacked. Here, M is an integer of 2 or more.

Each of the memory strings MS11 to MS1m and MS21 to MS2m may include at least one source select transistor SST, a plurality of memory cells MC, and at least one drain select transistor DST, connected in series.

The source select transistors SST, included in one memory string MS11 to MS1m and MS21 to MS2m, may be connected, in series, between the memory cells MC and the source line SL. Gate electrodes of the source select transistors SST are connected to the source select lines SSL. In addition, the source select transistors SST of the same level may be connected to the same source select line SSL.

The memory cells MC, included in one memory string MS11 to MS1m and MS21 to MS2m, may be connected, in series, between at least one source select transistor SST and at least one drain select transistor DST, Gate electrodes of the memory cells MC are connected to the word lines WL. Word line voltages (a program voltage, a pass voltage, a read voltage, and the like), required for driving, may be applied to each of the word lines WL. In addition, the memory cells MC of the same level may be connected to the same word line WL.

The drain select transistors DST, included in one memory string MS11 to MS1m and MS21 to MS2m, may be connected, in series, between the bit lines BL1 to BLm and the memory cells MC. Gate electrodes of the drain select transistors DST are connected to the drain select line DSL. The drain select transistors DST of the same level among the drain select transistors DST of the memory strings MS11 to MS1m and MS21 to MS2m, arranged in the same row (+X direction), may be connected to the same drain select line DSL. In addition, the drain select transistors DST, arranged in different rows (+X direction), may be connected to different drain select lines DSL.

Figure 3:
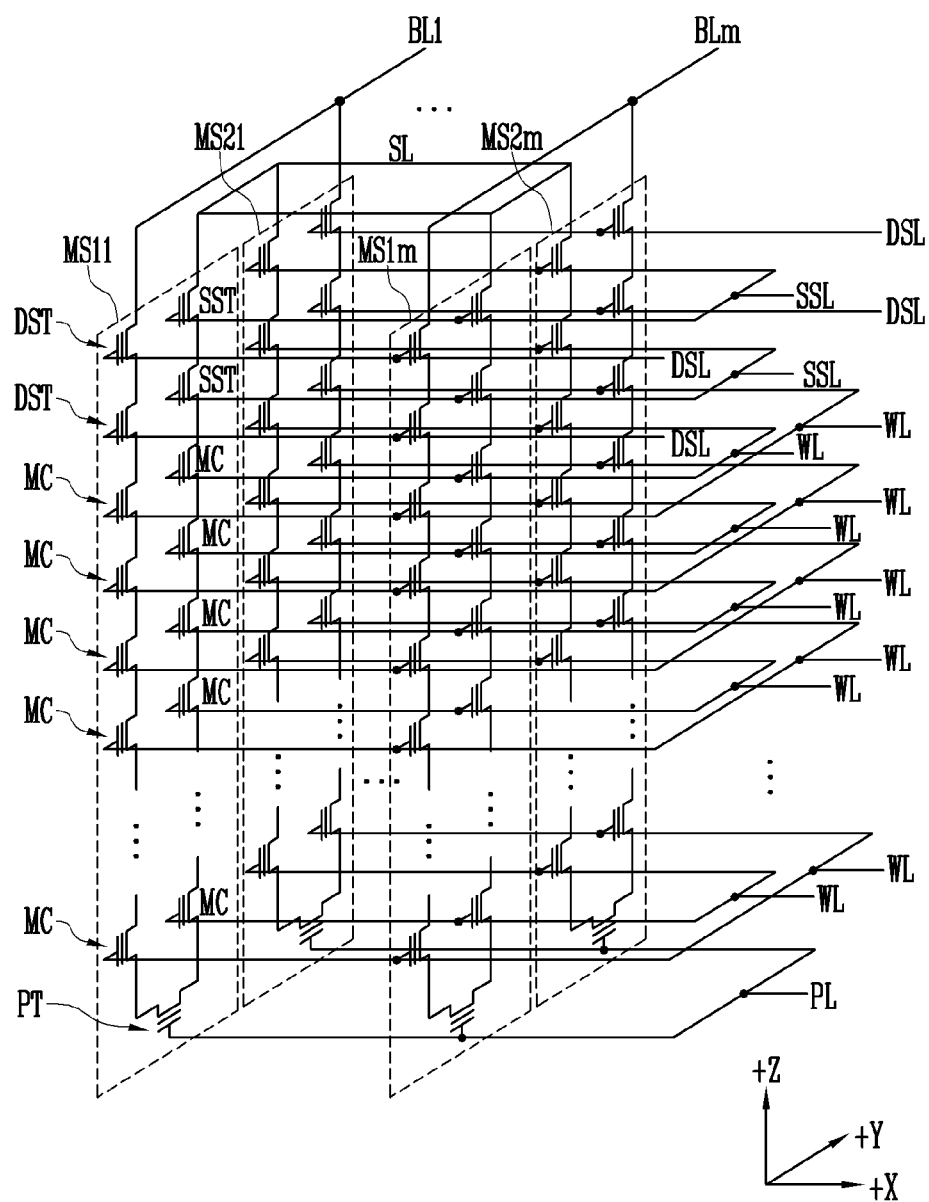
FIG. 3 is the circuit diagram of the cell array according to an embodiment of the present disclosure.

FIG. 3 is a circuit diagram of a cell array according to an embodiment of the present disclosure. The cell array may include a plurality of memory blocks BLK, and each memory block BLK may include memory cells MC arranged in a three dimension.

Referring to FIG. 3, the memory block BLK may include a plurality of memory strings MS11 to MS1m and MS21 to MS2m. Each of the memory strings MS11 to MS1m and MS21 to MS2m may include at least one source select transistor SST, a plurality of memory cells MC, at least one pipe transistor PT, and at least one drain select transistor DST. Here, each of the memory strings MS11 to MS1m and MS21 to MS2m may be arranged in a shape.

The pipe transistor PT connects the memory cells MC on the drain side to the memory cells MC on the source side. In addition, the gate of the pipe transistor PT of each of the memory strings MS11 to MS1m and MS21 to MS2m may be connected to the pipeline PL.

Since other structures are similar to those described with reference to FIG. 2, repetitive descriptions will be or witted.

Figure 4A:
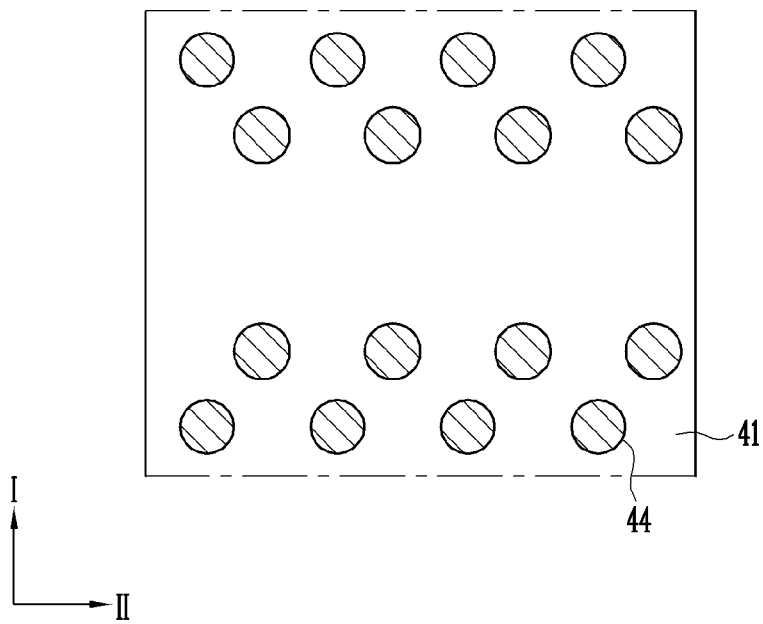
FIGS. 4A to 4F are diagrams, illustrating a structure of the semiconductor device, according to an embodiment of the present disclosure.
Figure 4B:
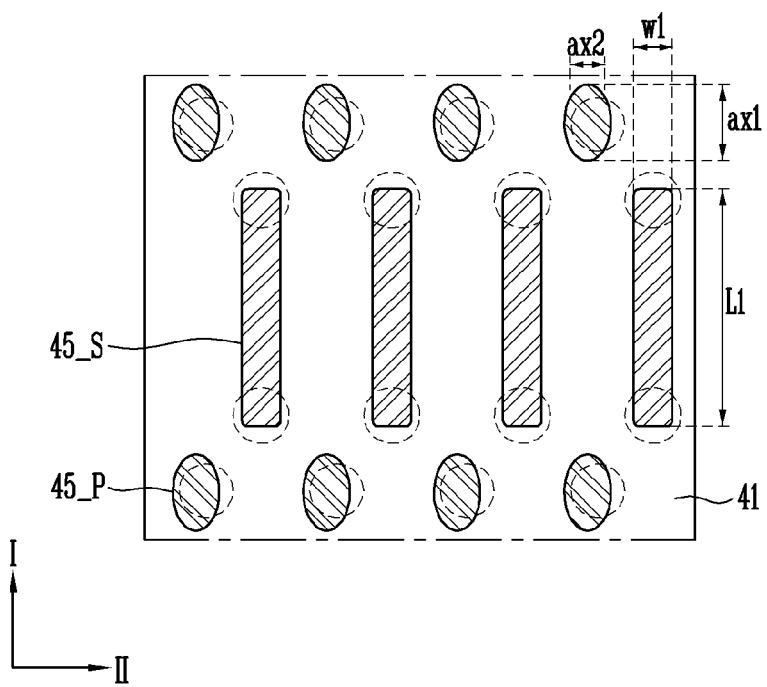
Figure 4C:
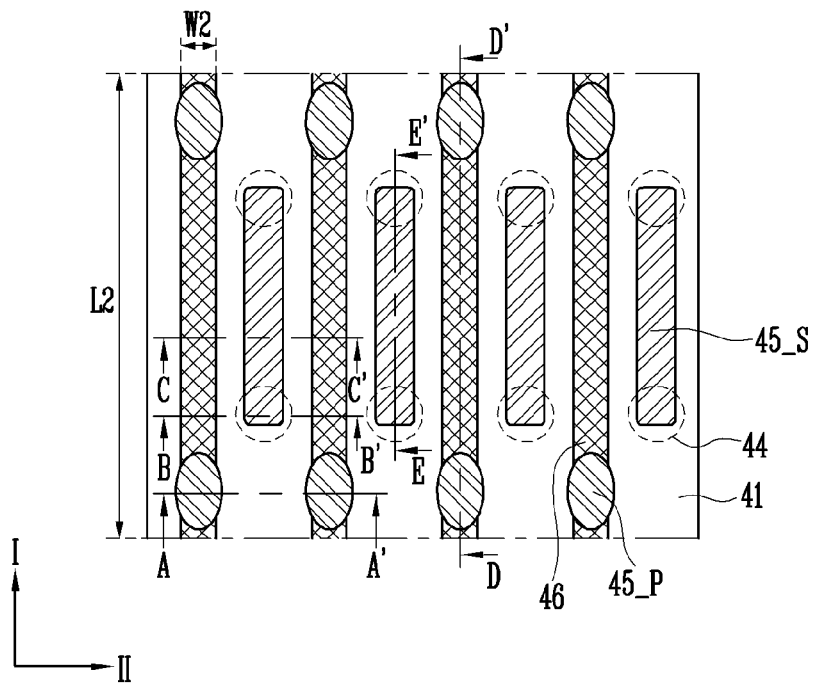
Figure 4D:
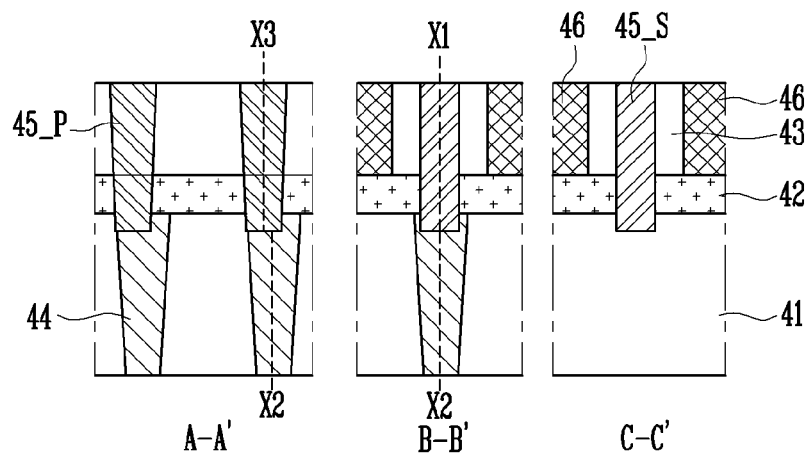
Figure 4E:
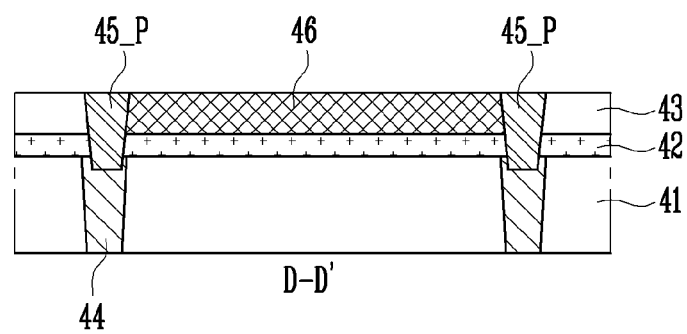
Figure 4F:
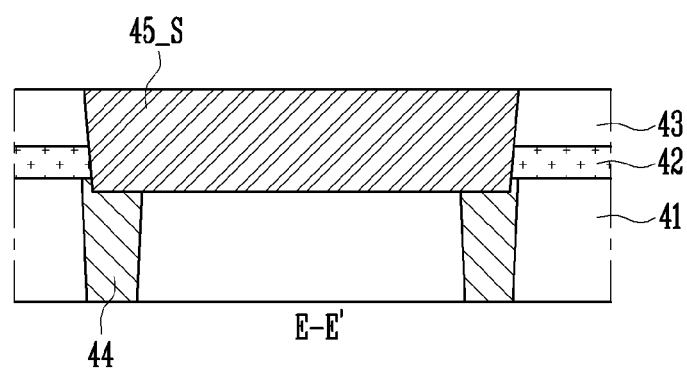

FIGS. 4A to 4F are diagrams, illustrating a structure of the semiconductor device, according to an embodiment of the present disclosure, FIGS. 4A to 4C are plan views, FIG. 4D is a cross-sectional view taken along a line A-A', a line B-B', and a line C-C' of FIG. 4C, FIG. 4E is a cross-sectional view taken along a line D-D' of FIG. 4C, and FIG. 4F is a cross-sectional view taken along a line E-E' of FIG. 4C.

Referring to FIGS. 4A to 4F, the semiconductor device, according to an embodiment of the present disclosure, may include an interconnect structure. The interconnect structure is an electrical connection structure that allows for the connection of a cell array, a peripheral circuit, a cell array to a peripheral circuit, a source line to a peripheral circuit, or a bit line to a page buffer. The interconnect structure may include a contact plug, an interconnect line, a pad, and the like.

The semiconductor device may further include a first interlayer insulating film 41 and a second interlayer insulating film 43. The interconnect structure may be formed in the first interlayer insulating film 41 and the second interlayer insulating film 43. For reference, the semiconductor device may further include an etch stop film 42 interposed between the first interlayer insulating film 41 and the second interlayer insulating film 43. In this case, the interconnect structure may be formed in the first interlayer insulating film 41, the second interlayer insulating film 43, and the etch stop film 42. The etch stop film 42 may include a material having a high etch selectivity with respect to the first and second interlayer insulating films 41 and 43. For example, the first and second interlayer insulating films 41 and 43 may include an oxide, and the etch stop film 42 may include a nitride, a high-k material, or the like.

The interconnect structure, according to the embodiment of the present disclosure, may include a plurality of first contact structures 44, slit-shaped second contact structures 45_S, plug-shaped second contact structures 45_P, and third contact structures 46.

The first contact structures 44 pass through the first interlayer insulating film 41. The first contact structures 44 may have a plug-shaped and may have a plane with a shape such as a circle, an ellipse, or a polygon. The first contact structures 44 may be arranged in a first direction I and a second direction II, crossing the first direction I. The second direction II may be perpendicular to the first direction I. In addition, some of the first contact structures 44 may be positioned so that a center is offset. For reference, the first contact structures 44 may have a slit-shaped extending in the first direction I or the second direction II.

The first contact structures 44 may be connected to a peripheral circuit, a cell array, or the like. For example, the first contact structures 44 may be directly connected to a transistor of a page buffer or may be directly connected to the bit lines.

The first contact structures may include a film including a metal such as tungsten (W). The first contact structures may also include a barrier film including titanium (Ti), titanium nitride (TiNx), tantalum (Ta), tantalum nitride (TaN), or tungsten nitride (WNx). Furthermore, the first contact structures may include a metal silicide film including titanium silicide (TiSix), tantalum silicide (TaSix), and tungsten silicide (WSix). Additionally, the first contact structure may include a combination thereof.

The plug-shaped second contact structures 45_P may be connected to some of first contact structures 44 of the plurality of the first contact structures 44. For example, the plug-shaped second contact structures 45_P may be connected to a first number of the plurality of first contact structures 44, respectively.

The plug-shaped second contact structures 45_P may be aligned or misaligned with the first contact structures 44. For example, the plug-shaped second contact structures 45_P may be positioned so that a center of the plug-shaped second contact structures 45_P is aligned or misaligned with the first contact structures 44. In the present drawing, the embodiment shows a center axis X2 of the first contact structures 44 and a center axis X3 of the plug-shaped second contact structures 45_P are misaligned with each other.

The plug-shaped second contact structures 45_P may have a plane with a shape such as a circle, an ellipse, a polygon, or the like. For example, the plug-shaped second contact structures 45_P may have a long axis ax1 extending in the first direction I and a short axis ax2 extending in the second direction II.

The slit-shaped second contact structures 45_S may be connected to other first contact structures 44 of the plurality of first contact structures 44. For example, the slit-shaped second contact structures 45_S may be connected to a second number of the plurality of first contact structures 44. The first contact structures 44 connected by the same slit-shape second contact structure 45_S may be adjacent to each other in the first direction I. For example, the first contact structures 44 adjacent in the first direction I among the first contact structures 44 except for the first contact structures 44 connected to the plug-shaped second contact structures 45_P among the first contact structures 44 may be commonly connected to one slit-shaped second contact structure 45_S. One slit-shaped second contact structure 45_S may connect at least two first contact structures 44.

The slit-shaped second contact structures 45_S may be aligned or misaligned with the first contact structures 44. For example, the slit-shaped second contact structures 45_S may be positioned so that a center of the slit-shaped second contact structures 45_S is aligned or misaligned with that of the first contact structures 44. In the present drawing, a case where a center axis X1 of the slit-shaped second contact structures 45_S and a center axis X1 of the first contact structures 44 are aligned with each other is shown.

The slit-shaped second contact structures 45_S may extend in the first direction I. The slit-shaped second contact structures 45_S may have a length L1 of the first direction I and a width W1 of the second direction II, and the length L1 may have a value larger than that of the width W1.

The slit-shaped second contact structures 45_S may be arranged along the second direction II, A distance between the slit-shaped second contact structures 45_S adjacent in the second direction II may be uniform.

The slit-shaped second contact structures 45_S and the plug-shaped second contact structures 45_P may be simultaneously formed. Therefore, the slit-shaped second contact structures 45_S and the plug-shaped second contact structures 45_P may be positioned at substantially the same level and may include the same material.

The slit-shaped second contact structures 45_S and the plug-shaped second contact structures 45_P may pass through the second interlayer insulating film 43 and the etch stop film 42. In addition, the slit-shaped second contact structures 45_S may extend to the first interlayer insulating film 41, and the plug-shaped second contact structures 45_P may extend to the first contact structures 44.

Upper surfaces of the slit-shaped second contact structures 45_S and upper surfaces of the plug-shaped second contact structures 45_P may be positioned on the same plane, Lower surfaces of the slit-shaped second contact structures 45_S and lower surfaces of the plug-shaped second contact structures 45_P may be positioned on the same plane. In addition, the lower surfaces of the slit-shaped second contact structures 45_S and the lower surfaces of the plug-shaped second contact structures 45_P may be positioned to be lower than upper surfaces of the first contact structures 44. In other words, the lower surfaces of the slit-shaped second contact structures 45_S and the lower surfaces of the plug-shaped second contact structures 45_P may be positioned to be lower than lower surfaces of the etch stop film 42.

The third contact structures 46 are connected to sidewalls of the plug-shaped second contact structures 45_P. For example, the third contact structures 46 connect the plug-shaped second contact structures 45_P adjacent in the first direction I. The third contact structures 46 may be in direct contact with the sidewalk of the plug-shaped second contact structures 45_P. Therefore, the plug-shaped second contact structures 45_P may be used as the interconnect line together with the third contact structures 46. In other words, the third contact structure 46 and the plug-shaped second contact structures 45_P having the sidewalk connected to the third contact structure 46 may configure one interconnect line.

The third contact structures 46 may have a line-shape extending in the first direction I. The third contact structures 46 may have a length L2 in the first direction I and a width W2 in the second direction II, and the length L2 may have a value larger than that of the width W2. The third contact structures 46 may have the length (L2>L1) longer than that of the slit-shaped second contact structures 45_S, The third contact structures 46 may have the width (W2=W1) substantially the same as the slit-shaped second contact structures 45_S, or may have the width (W2≠W1) different from that of the slit-shaped second contact structures 45_S. In the present drawing, a case where the third contact structures 46 have the width (W2<W1) narrower than that of the slit-shaped second contact structures 45_S is shown.

The third contact structures 46 may be aligned or misaligned with the plug-shaped second contact structures 45_P. For example, the third contact structures 46 may be positioned so that a center of the third contact structures 46 is aligned or misaligned with that of the plug-shaped second contact structures 45_P. In the present drawing, a case where a center axis X3 of the third contact structures 46 and a center axis X3 of the plug-shaped second contact structures 45_P are aligned with each other is shown.

The third contact structures 46 may be aligned or misaligned with the first contact structures 44. For example, the third contact structures 46 may be positioned so that the center of the third contact structures 46 is aligned or offset with that of the first contact structures 44. The present drawing shows a case where the center axis X3 of the third contact structures 46 and the center axis X1 of the first contact structures 44 are offset with each other. Even though the third contact structures 46 and the first contact structures 44 are misaligned with each other, the third contact structures 46 may be connected to the first contact structures 44 through the plug-shaped second contact structures 45_P.

The third contact structures 46 may be arranged along the second direction II. The distance between the third contact structures 46, adjacent in the second direction II, may be uniform. In addition, the third contact structures 46 and the slit-shaped second contact structures 45_S may be adjacent to each other in the second direction II. For example, the third contact structures 46 and the slit-shaped second contact structures 45_S may be alternately arranged along the second direction II.

The third contact structures 46 and the slit-shaped second contact structures 45_S may be positioned at substantially the same level. Upper surfaces of the third contact structures 46 and upper surfaces of the plug-shaped second contact structures 45_P may be positioned on the same plane, Lower surfaces of the third contact structures 46 may be positioned at a level that is different from that of lower surfaces of the plug-shaped second contact structures 45_P. For example, the third contact structures 46 may pass through the second interlayer insulating film 43, but might not pass through the etch stop film 42, In this case, the lower surfaces of the third contact structures 46 may be positioned at a level that is higher than that of the lower surfaces of the slit-shaped second contact structures 45_S. For reference, when the etch stop film 42 is omitted, the plug-shaped second contact structures 45_P may pass through the second interlayer insulating film 43 at a depth that is deeper than that of the third contact structures 46. That is, the third contact structures 46 may pass through the second interlayer insulating film 43 at a certain depth, and the plug-shaped second contact structures 45_P may completely pass through the second interlayer insulating film 43.

The third contact structures 46 and the slit-shaped second contact structures 45_S may be formed using separate processes. For example, after forming the slit-shaped second contact structures 45_S, the third contact structures 46 may be formed. Alternatively, before forming the slit-shaped second contact structures 45_S, the third contact structures 46 may be formed. Therefore, each of the third contact structures 46 may be positioned to be spaced apart from each other by the same distance from the slit-shaped second contact structures 45_S of both sides, or may be disposed to be biased to the slit-shaped second contact structure 45S of one side.

The slit-shaped second contact structures 45_S, the plug-shaped second contact structures 45_P, and the third contact structures 46 may include a film including a metal such as tungsten (W), may include a barrier film including titanium (Ti), titanium nitride (TiNx), tantalum (Ta), tantalum nitride (TaN), or tungsten nitride (WNx), may include a metal silicide film including titanium silicide (TiSix), tantalum silicide (TaSix), and tungsten silicide (WSix), or may include a combination thereof.

For reference, the widths, lengths, axes, positions, arrangements, and the like of the first contact structures 44, the slit-shaped second contact structures 45_S, the plug-shaped second contact structures 45_P, and the third contact structures 46 are described as an embodiment, and the present disclosure is not limited thereto. The above-described embodiment may be changed within the purpose of the present disclosure based on a disposition of the bit lines, an arrangement of an active region, an arrangement of the transistor, a breakdown voltage margin, a resolution of an exposure apparatus, and the like.

According to the structure as described above, the third contact structures 46 are connected with the sidewalk of the plug-shaped second contact structures 45_P and the third contact structures 46 are connected to the first contact structures 44 through the plug-shaped second contact structures 45_P. In this case, even though the third contact structures 46 are spaced apart from the first contact structures 44, the third contact structures 46 may be connected to the first contact structures 44 through the plug-shaped second contact structures 45_P. Therefore, an alignment margin may be secured.

In addition, the plug-shaped second contact structures 45_P, the slit-shaped second contact structures 45_S, and the third contact structures 46 may be used as the interconnect line. In addition, a pattern finer than that of the resolution of the exposure apparatus may be formed, by forming the slit-shaped second contact structures 45_S and the third contact structures 46 by separate processes. Alternatively, the exposure apparatus may be downgraded and used.

Figure 5A:
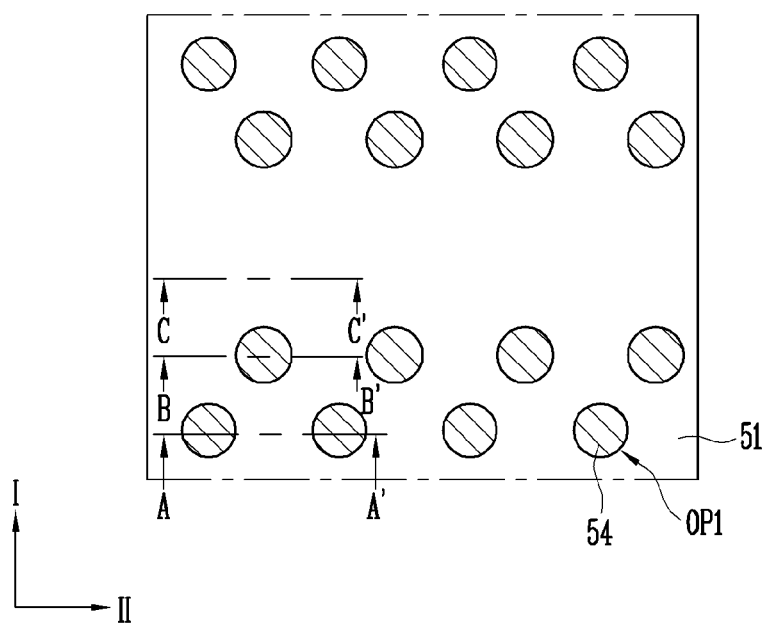
FIGS. 5A to 5B, 6A to 6B, and 7A to 7B are diagrams for describing a method of manufacturing the semiconductor device according to an embodiment of the present disclosure.
Figure 5B:
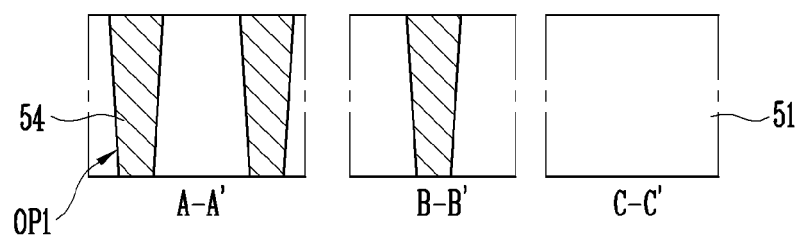
Figure 6A:
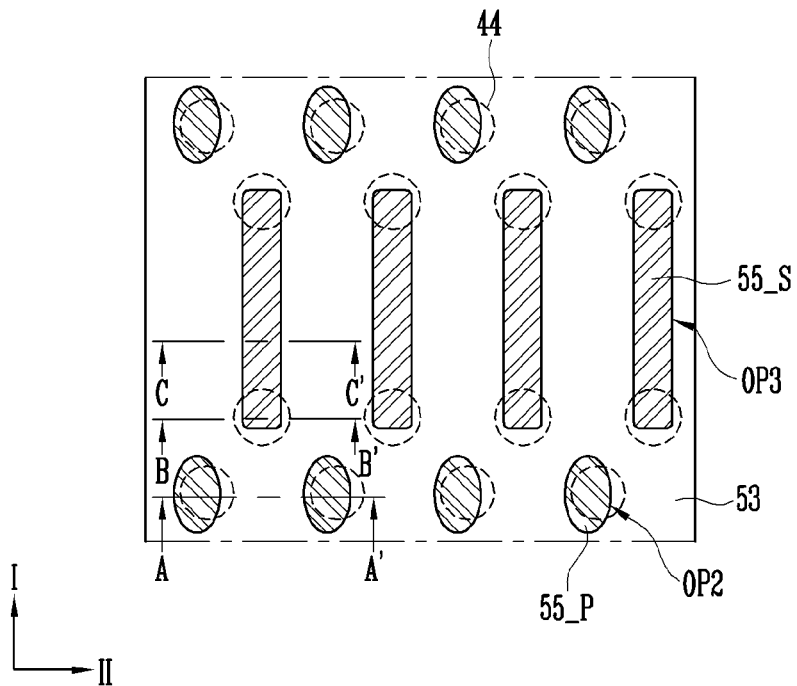
Figure 6B:
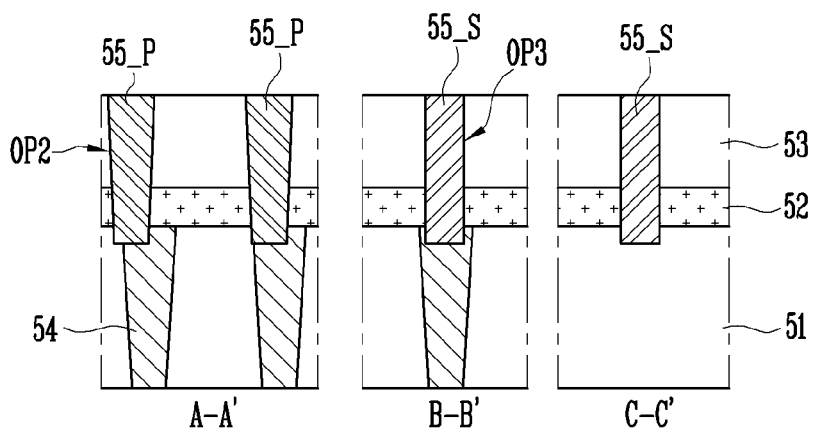
Figure 7A:
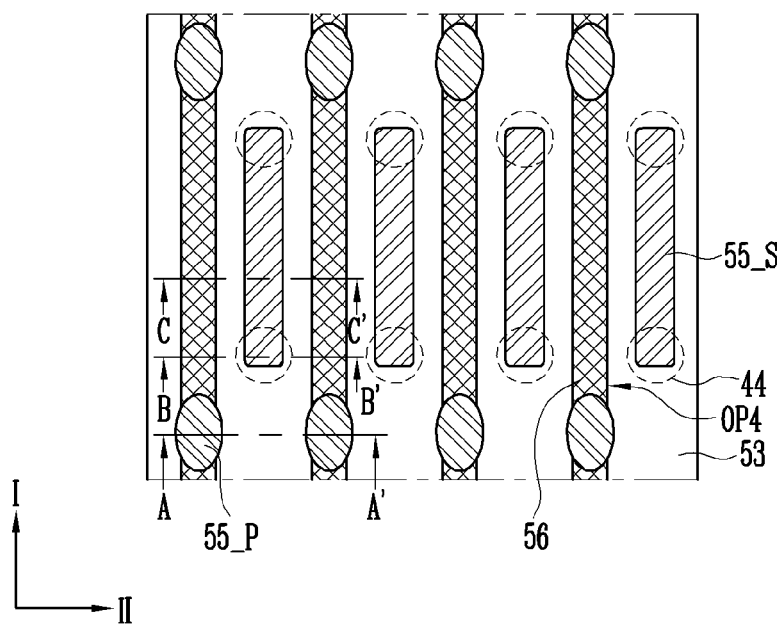
Figure 7B:
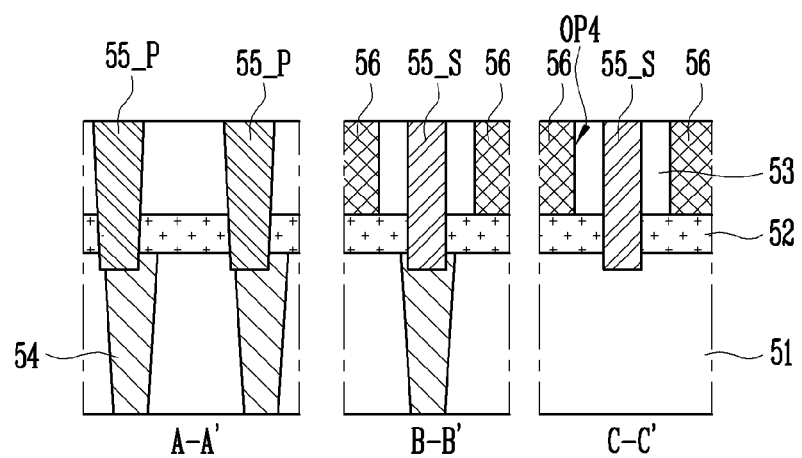

FIGS. 5A to 7A and 5B to 7B are diagrams for describing a method of manufacturing the semiconductor device according to an embodiment of the present disclosure. FIGS. 5A, 6A, and 7A are plan views. FIGS. 5B, 6B, and 7B are cross-sectional views taken along a line A-A', a line B-B', and a line C-C' of the plan view, Hereinafter, description repetitive to the above description will be omitted.

Referring to FIGS. 5A and 5B, a first interlayer insulating film 51 is formed on a lower structure. The lower structure may include a substrate, a peripheral circuit, a transistor, a page buffer, a resistor, a capacitor, and the like. The first interlayer insulating film 51 may include an insulating material such as an oxide.

Next, first contact structures 54 are formed. For example, after forming first openings OP1, passing through the first interlayer insulating film 51, conductive films are formed in the first openings OP1. Therefore, the first contact structures 54, electrically connected to the lower structure, may be formed.

The first openings OP1 may have a plane with a shape such as a circle, an ellipse, a polygon, or the like. The first openings OP1 may be arranged in the first direction T and the second direction II, crossing the first direction I. In addition, some of the first openings OP1 may be positioned so that a center of the first openings OP1 is offset. For reference, the first openings OP1 may have a slit-like shape, extending in the first direction I or the second direction II.

In the embodiment, each of the first contact structures 54 may include a barrier film and a metal film. For example, after forming the barrier film along a profile of the first interlayer insulating film 51 through which the first openings OP1 are formed, the metal film is formed to fill the first openings OP1. Next, the metal film and the barrier film are polished until the first interlayer insulating film 51 is exposed. A polishing process may use a chemical mechanical polishing (CMP) process. In addition, the barrier film may be omitted and the metal film may be formed. As another embodiment, each of the first contact structures 54 may include a silicide film. For example, after forming a metal film and a polysilicon film in the first openings OP1, the silicide film is formed by performing a heat treatment process. For example, the silicide film may include titanium silicide (TiSix).

Referring to FIGS. 6A and 63, an etch stop film 52 is formed on the first interlayer insulating film 51, and a second interlayer insulating film 53 is formed on the etch stop film 52. The second interlayer insulating film 53 may include an insulating material such as an oxide. The etch stop film 52 may include a material having a high etch selectivity with respect to the first and second interlayer insulating films 51 and 53. For example, the first and second interlayer insulating films 51 and 53 may include an oxide, and the etch stop film 52 may include a nitride, a high-k material, or the like. For reference, the etch stop film 52 may be omitted and the second interlayer insulating film 53 may be formed.

Next, the plug-shaped second contact structures 55_P and the slit-shaped second contact structures 55_S are formed. For example, after forming second openings OP2 and third openings OP3 passing through the second interlayer insulating film 53 and the etch stop film 52, conductive films are formed in the second and third openings OP2 and OP3. Therefore, the plug-shaped second contact structures 55_P and the slit-shaped second contact structures 55_S, electrically connected to the first contact structures 54, may be formed.

The second and third openings OP2 and OP3 may be formed by etching the etch stop film 52 after etching the second interlayer insulating film 53. In the case of the second openings OP2, the second interlayer insulating film 53 is first etched to form preliminary second openings exposing the etch stop film 52. Next, the etch stop film 52, exposed through the preliminary second openings, is etched. Therefore, the second openings OP2, exposing their respective first contact structures 54, may be formed. In the case of the third openings OP3, the second interlayer insulating film 53 is first etched to form preliminary third openings exposing the etch stop film 52, Next, the etch stop film 52, exposed through the preliminary third opening, is etched to form the third openings OP3, The third openings OP3 may expose their respective first contact structures 54 adjacent in the first direction I. Meanwhile, when the etch stop film 52 is etched, the first interlayer insulating film 51 and the first contact structures 54 may be etched at a certain depth. In addition, when the second openings OP2 are formed, the third openings OP3 may be formed. In other words, the second openings OP2 and the third openings OP3 may be simultaneously formed.

The respective second openings OP2 may be formed to expose at least one or more first contact structures 54, For example, the second openings OP2 and the first contact structures 54 may be matched 1:1. Each of the second openings OP2 may have a plane such as a circle, an ellipse, a polygon, or the like. For example, each of the second openings OP2 may have an elliptical plane having a long axis extending in the first direction I.

Each of the third openings OP3 may be formed to expose a plurality of first contact structures 54. For example, the third openings OP3 and the first contact structures 54 may be matched 1:m. Here, m may be an integer of 2 or more. Each of the third openings OP3 may have a slit-shaped extending in the first direction I, The third openings OP3 may have the same length or different lengths in the first direction I. Each of the third openings OP3 may have a slit-shaped extending in the first direction T and may expose the first contact structures 54 adjacent in the first direction I.

The plug-shaped second contact structures 55_P may be formed in the second openings OP2. The plug-shaped second contact structures 55_P may pass through the second interlayer insulating film 53 and the etch stop film 52 and may be connected to the first contact structures 54, respectively. The slit-shaped second contact structures 55_S may be formed in the third openings OP3. The slit-shaped second contact structures 55_S may pass through the second interlayer insulating film 53 and the etch stop film 52, and may connect the first contact structures 54 adjacent in the first direction I.

When the plug-shaped second contact structures 55_P are formed, the slit-shaped second contact structures 55_S may be formed. In other words, the plug-shaped second contact structures 55_P and the slit-shaped second contact structures 55_S may be simultaneously formed. In addition, each of the plug-shaped second contact structures 55_P and the slit-shaped second contact structures 55_S may include a barrier film and a metal film. For example, after forming the barrier film along a profile of the second interlayer insulating film 53 and the etch stop film 52 through which the second and third openings OP2 and OP3 are formed, the metal film is formed to fill the second and third openings OP2 and OP3. Next, the metal film and the barrier film are polished until the second interlayer insulating film 53 is exposed. A polishing process may use a CMP process. In addition, the barrier film may be omitted and the metal film may be formed.

Referring to FIGS. 7A and 7B, third contact structures 56 are formed. For example, after forming the fourth openings OP4 passing through the second interlayer insulating film 53, conductive films are formed in the fourth openings OP4. Here, the fourth openings OP4 may be formed to expose the plug-shaped second contact structures 55_P. Therefore, the third contact structures 56 electrically connected to the plug-shaped second contact structures 55_P may be formed. Thus, an interconnect structure including the first contact structures 54, the plug-shaped second contact structures 55_P, the slit-shaped second contact structures 55_S, and the third contact structures 56 is formed.

The fourth openings OP4 may be formed by etching the second interlayer insulating film 53 to expose the etch stop film 52. Therefore, the fourth openings OP4 may be formed to have a depth shallower than that of the third openings OP3.

Each of the fourth openings OP4 may be formed to expose a plurality of plug-shaped second contact structures 55_P. For example, the fourth openings OP4 and the plug-shaped second contact structures 55_P may be matched 1:n. Here, n may be an integer of 2 or more. In addition, each of the fourth openings OP4 may be formed to expose the sidewalls of the plug-shaped second contact structures 55_P adjacent in the first direction I.

Each of the fourth openings OP4 may have a line-shape extending in the first direction I. The fourth openings OP4 may have the same length or different lengths in the first direction I. For example, each of the fourth openings OP4 may expose the plug-shaped second contact structures 55_P adjacent in the first direction I.

The fourth openings OP4 may be formed to be adjacent to the slit-shaped contact structures 55_S in the second direction II. For example, the fourth openings OP4 and the slit-shaped second contact structures 55_S may be alternately positioned along the second direction II.

The third contact structures 56 may be formed in the fourth openings OP4. The third contact structures 56 may pass through the second interlayer insulating film 53 and may connect the plug-shaped second contact structures 55_P adjacent in the first direction I. For example, the third contact structures 56 may be directly in contact with the sidewalls of the plug-shaped second contact structures 55_P.

Each of the third contact structures 56 may include a barrier film and a metal film. After forming the barrier film along a profile of the second interlayer insulating film 53 through which the fourth openings OP4 are formed, the metal film is formed to fill the fourth openings OP4. Next, the metal film and the barrier film are polished until the second interlayer insulating film 53 is exposed. A polishing process may use a CMP process. In addition, the barrier film may be omitted and the metal film may be formed.

According to the manufacturing method as described above, the plug-shaped second contact structures 55_P and the third contact structure 56 that are in contact with the sidewalls of the plug-shaped second contact structures 55_P may configure one interconnect line. Therefore, even though the first contact structures 54 and the third contact structures 56 are spaced apart from each other, the first contact structures 54 and the third contact structures 56 may be connected through the plug-shaped second contact structures 55_P. That is, even though the interconnect line is not formed in a bent form, an alignment issue (align issue) may be resolved.

In addition, the plug-shaped first contact structures 55_P, the slit-shaped second contact structures 55_S, and the third contact structures 56 may be used as the interconnect line. Therefore, a pattern finer than that of the resolution of the exposure apparatus may be formed. Alternatively, the exposure apparatus may be downgraded and used.

Figure 8A:
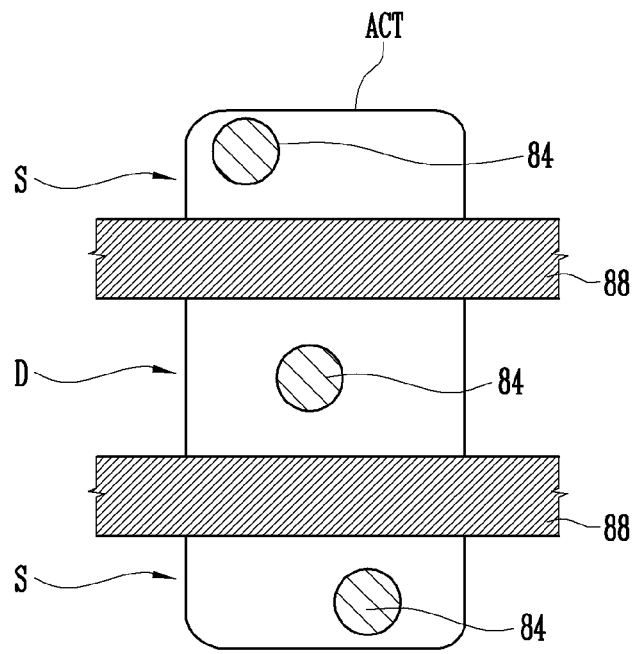
FIGS. 8A to 8F are diagrams, illustrating a structure of a semiconductor device, including an interconnect structure and a page buffer, according to an embodiment of the present disclosure.
Figure 8A:
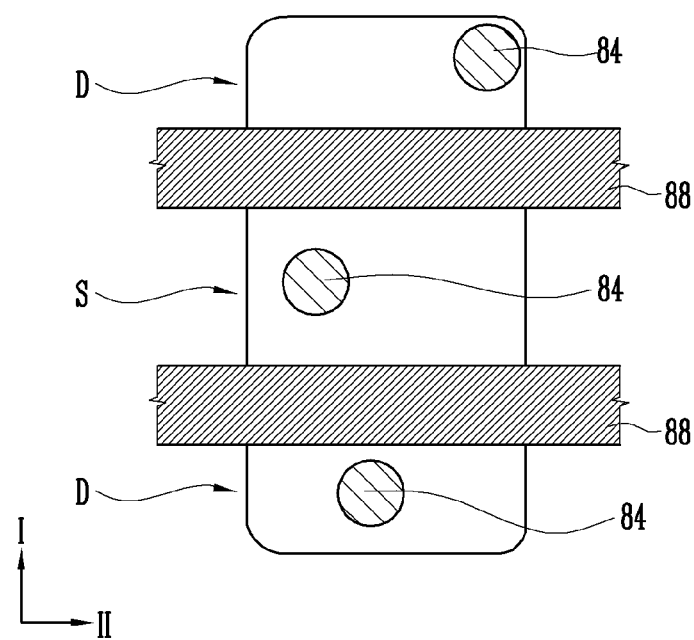
Figure 8B:
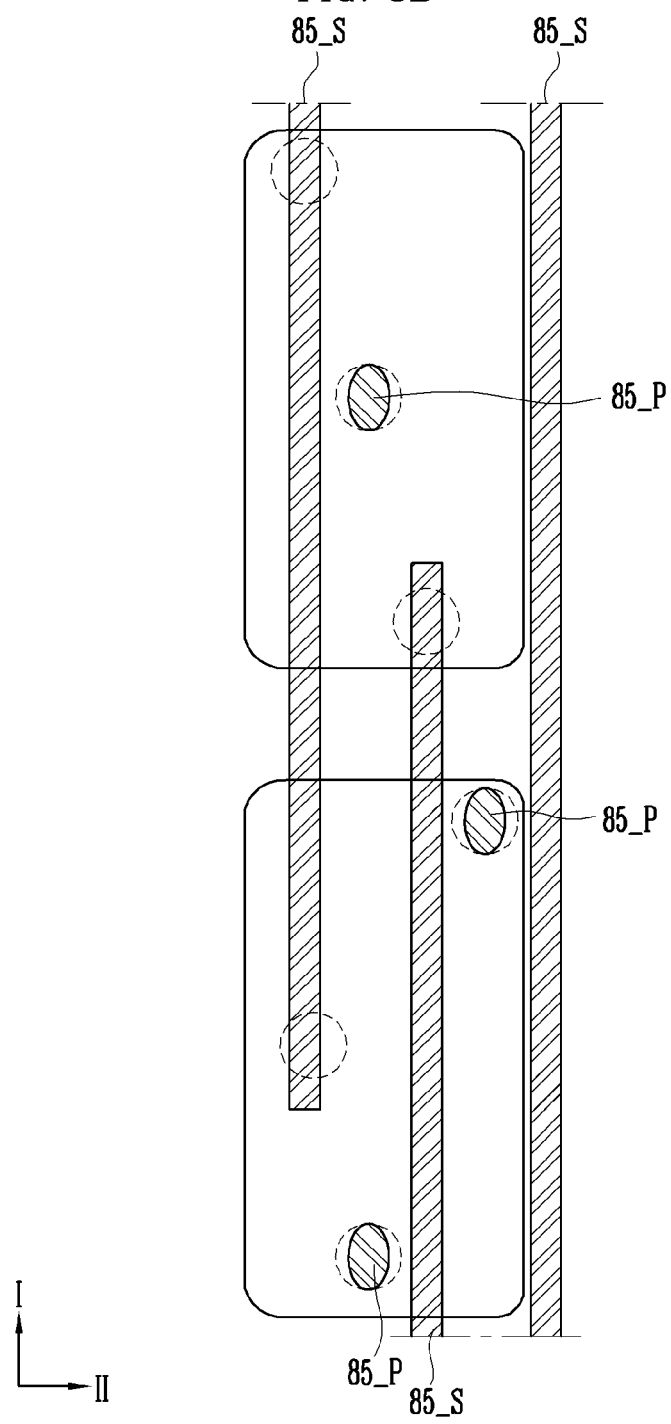
Figure 8C:
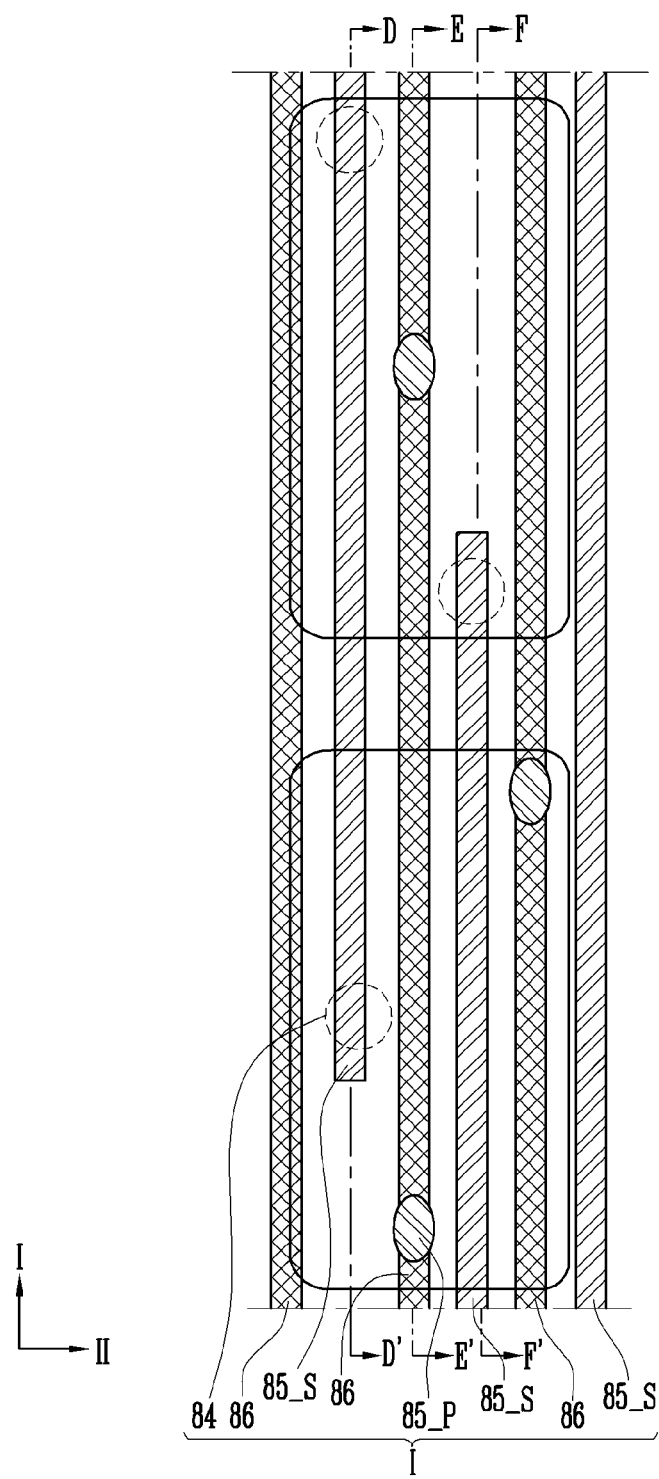
Figure 8D:
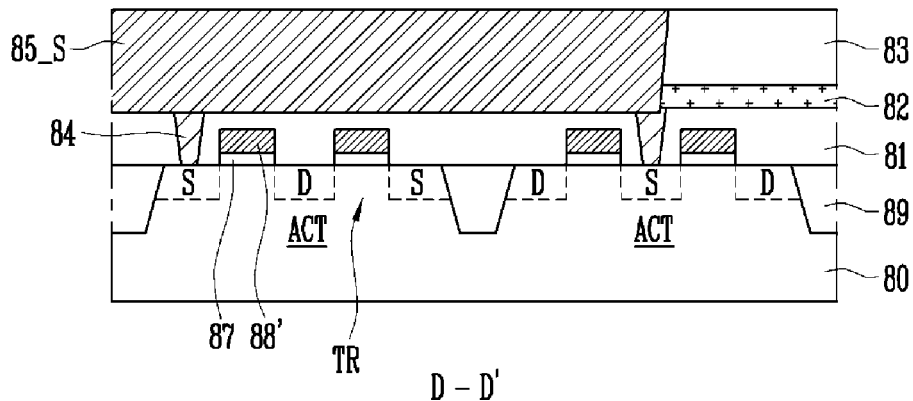
Figure 8E:
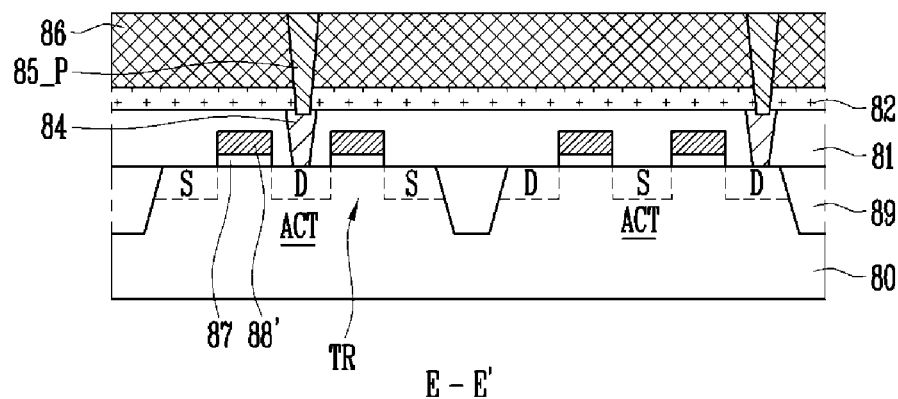
Figure 8F:
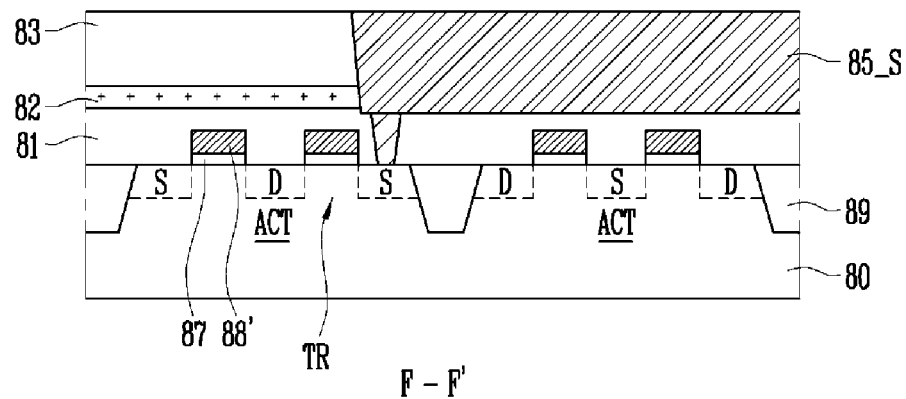

FIGS. 8A to 8F are diagrams, illustrating a structure of a semiconductor device, including an interconnect structure and a page buffer according to an embodiment of the present disclosure. FIG. 8D is a cross-sectional view taken along a line D-D' of FIG. 8C, FIG. 8E is a cross-sectional view taken along a line E-E' of FIG. 8C, and FIG. 8F is a cross-sectional view taken along a line F-F' of FIG. 8C. Hereinafter, description repetitive to the above description will be omitted.

Referring to FIGS. 8A to 8F, the semiconductor device according to an embodiment may include a substrate 80, a transistor TR, and an interconnect structure I. Here, the transistor TR may belong to a page buffer.

The substrate 80 may include element isolation films 89, and may include active regions ACT defined by the element isolation films 89. Gate lines 88 may be positioned on the active regions ACT. The active regions ACT may be arranged in the first direction I, and the gate lines 88 may extend in the second direction II.

The transistors TR may be positioned in the active regions ACT of the substrate 80. Each of the transistors TR may include a gate electrode 88', a gate insulating film 87, a source region S, and a drain region D. A region where the active regions ACT and the gate lines 88 cross each other may be the gate electrode 88' of each transistor TR. The source region S and the drain region D may be formed in the substrate 80 of both sides of the gate electrode 88'. The source region S and the drain region D may be regions in which an N type or P type impurity is doped.

The interconnect structure I may be electrically connected to the page buffer. The interconnect structure I may include a plurality of first contact structures 84, plug-shaped second contact structures 85_P, slit-shaped second contact structures 85_S, and third contact structures 86.

The first contact structures 84 may be connected to the source region S or the drain region D in the active regions ACT. The plug-shaped second contact structures 85_P may be connected to a first number of the plurality of first contact structures 84, respectively. The slit-shaped second contact structures 85_S may be connected to a second number of the plurality of first contact structures 84. The first contact structures 84 adjacent in the first direction I may be connected to the same slit-shaped second contact structure 85_S. The third contact structures 86 may be connected to sidewalk of the plug-shaped second contact structures 85_P. Each of the third contact structures 86 may connect the plug-shaped second contact structures 85_P adjacent in the first direction I.

The interconnect structure I may be positioned between the page buffer and a cell array. The source region S or the drain region D may be connected to the slit-shaped second contact structure 85_S through one of the second number of the plurality of first contact structures 84, In addition, the drain region D or the source region S may be connected to the third contact structure 86 through one of the first number of the plurality of first contact structures 84 and one of the plug-shaped second contact structures 85_P. Thus, the source region S or the drain region D may be connected to the bit line through the interconnect structure I.

Figure 9:
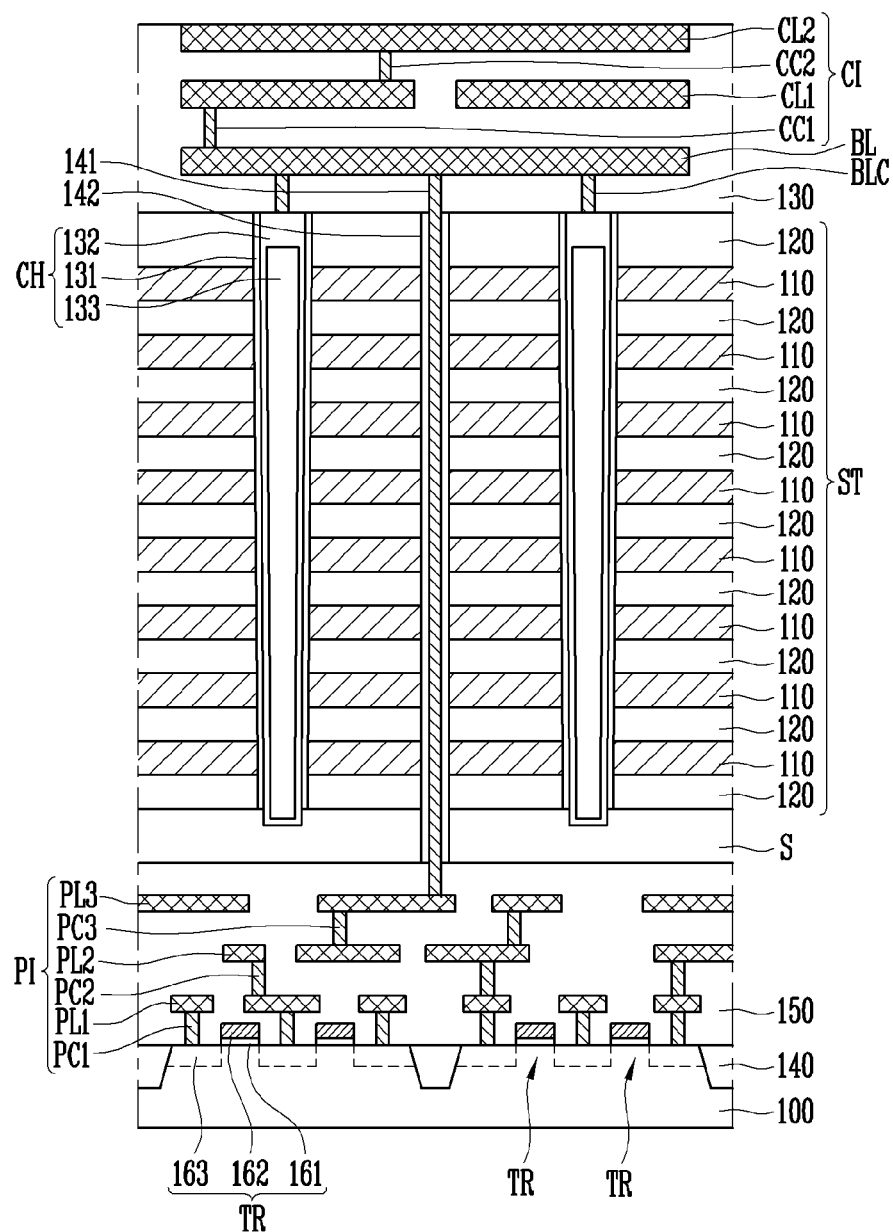
FIG. 9 is a diagram, illustrating a structure of the semiconductor device to which the interconnect structure, according to an embodiment of the present disclosure is applied.

FIG. 9 is a diagram, illustrating a structure of the semiconductor device to which the interconnect structure, according to an embodiment of the present disclosure is applied. Hereinafter, description repetitive to the above description will be omitted.

Referring to FIG. 9, the semiconductor device, according to an embodiment of the present disclosure, may include a cell array C and a peripheral circuit P positioned under the cell array C.

The cell array C may include a source structure 5, a stack ST, a channel structure CH, a first interlayer insulating film 130, a bit line contact BLC, a bit line BL, and an interconnect structure CI. The source structure S may be a conductive film such as polysilicon or metal. Alternatively, the source structure S may be a substrate in which a source region including a P type or N type impurity is defined. For reference, the source structure S may correspond to the source line SL described above with reference to FIGS. 2 and 3.

The stack ST may be positioned on the source structure S, The stack ST may include conductive films 110 and insulating films 120 that are alternately stacked. The conductive films 110 may be a gate electrode of a selection transistor, a memory cell, and the like, and may include polysilicon, tungsten, a metal, or the like. The insulating films 120 may insulate the stacked gate electrodes from each other and may include an insulating material such as an oxide or a nitride. The stack ST may include sacrificial films and the insulating films 120 that are alternately stacked in some regions. Here, the sacrificial films may be positioned at the same level as the conductive films 110.

The channel structure CH passes through the stack ST. The channel structure CH may include a channel film 132, a memory film 131, and a gap fill insulating film 133. The channel structure CH may be connected to the source structure S, and the channel film 132 may be protruded to the inside of the source structure S. In addition, the channel structure CH may be connected to the bit line BL through the bit line contact BLC.

The channel film 132 may include a semiconductor material such as silicon (Si) or germanium (Ge). The channel film 132 may be directly connected to the source structure S or may be connected to the source structure S through an epitaxial semiconductor layer.

The memory film 131 may be formed to surround a sidewall of the channel film 132. The memory film 131 may include at least one of a tunnel insulating film, a data storage film, and a charge blocking film. The data storage film may include a floating gate, a charge trap material, silicon, nitride, nano dot, variable resistance material, phase change material, and the like. The gap fill insulating film 133 may be formed in the channel film 132 and may include an oxide.

The interconnect structure CI may include contact plugs CC1 and CC2 and interconnect lines CL1 and CL2. The interconnect structure CI may be formed in the first interlayer insulating film 130, Although the first interlayer insulating film 130 is shown as one film in the present drawing, the first interlayer insulating film 130 may include stacked insulating films.

The interconnect structure CI may have a structure according to the embodiments described above with reference to FIGS. 1 to 8F. For example, the contact plugs CC1 and CC2 may correspond to the first contact structures 44 or the first contact structures 54, In addition, the interconnect lines CL1 and CL2 may correspond to the plug-shaped second contact structures 45_P, the slit-shaped second contact structures 45_S, and the third contact structures 46, or may correspond to the plug-shaped second contact structures 55_P, the slit-shaped second contact structures 55_S, and the third contact structures 56.

The peripheral circuit P may include a substrate 100, a transistor TR, an interconnect structure PI, an element isolation film 140, and a second interlayer insulating film 150. The element isolation film 140 may be formed in the substrate 100, and an active region may be defined by the element isolation film 140. The transistor TR may belong to a page buffer, an address decoder, or the like.

The transistor TR may include a gate insulating film 161, a gate electrode 162, and a junction 163. The gate insulating film 161 may be interposed between the substrate 100 and the gate electrode 162. The junction 163 may be formed in the substrate 100 and may be positioned at both sides of the gate electrode 162. For example, the junction 163 may be a source region or a drain region.

The interconnect structure PT may include contact plugs PC1 to PC3 and interconnect lines PL1 to PL3. The interconnect structure PT may be formed in the second interlayer insulating film 150, Although the second interlayer insulating film 150 is shown as one film in the present drawing, the second interlayer insulating film 150 may include stacked insulating films.

The interconnect structure PT may have the structure according to the embodiments described above with reference to FIGS. 1 to 8F. For example, the contact plugs PC1 to PC3 may correspond to the first contact structures 44, the first contact structures 54, or the first contact structures 84. In addition, the interconnect lines PL1 to PL3 may correspond to the plug-shaped second contact structures 45_P, the slit-shaped second contact structures 45_S, and the third contact structures 46, may correspond to the plug-shaped second contact structures 55_P, the slit-shaped second contact structures 55_S, and the third contact structures 56, or may correspond to the plug-shaped second contact structures 85_P, the slit-shaped second contact structures 85_S, and the third contact structures 86.

The interconnect structure PI may be electrically connected to the bit line BL through a contact plug 141 passing through the stack ST. When the contact plug 141 passes through the conductive films 110 and the insulating films 120, a spacer 142 may be formed on a sidewall of the contact plug 141. For reference, the contact plug 141 may pass through a region where the sacrificial films and the insulating films 120 are alternately stacked in the stack ST. In this case, the spacer 142 may be omitted. Alternatively, the interconnect structure PI may be electrically connected to the bit line BL through a contact plug passing through the first and second interlayer insulating films 130 and 150 in a region where the stack ST is not formed.

According to the structure described above, the peripheral circuit P may be positioned on or under the cell array C.

Figure 10:
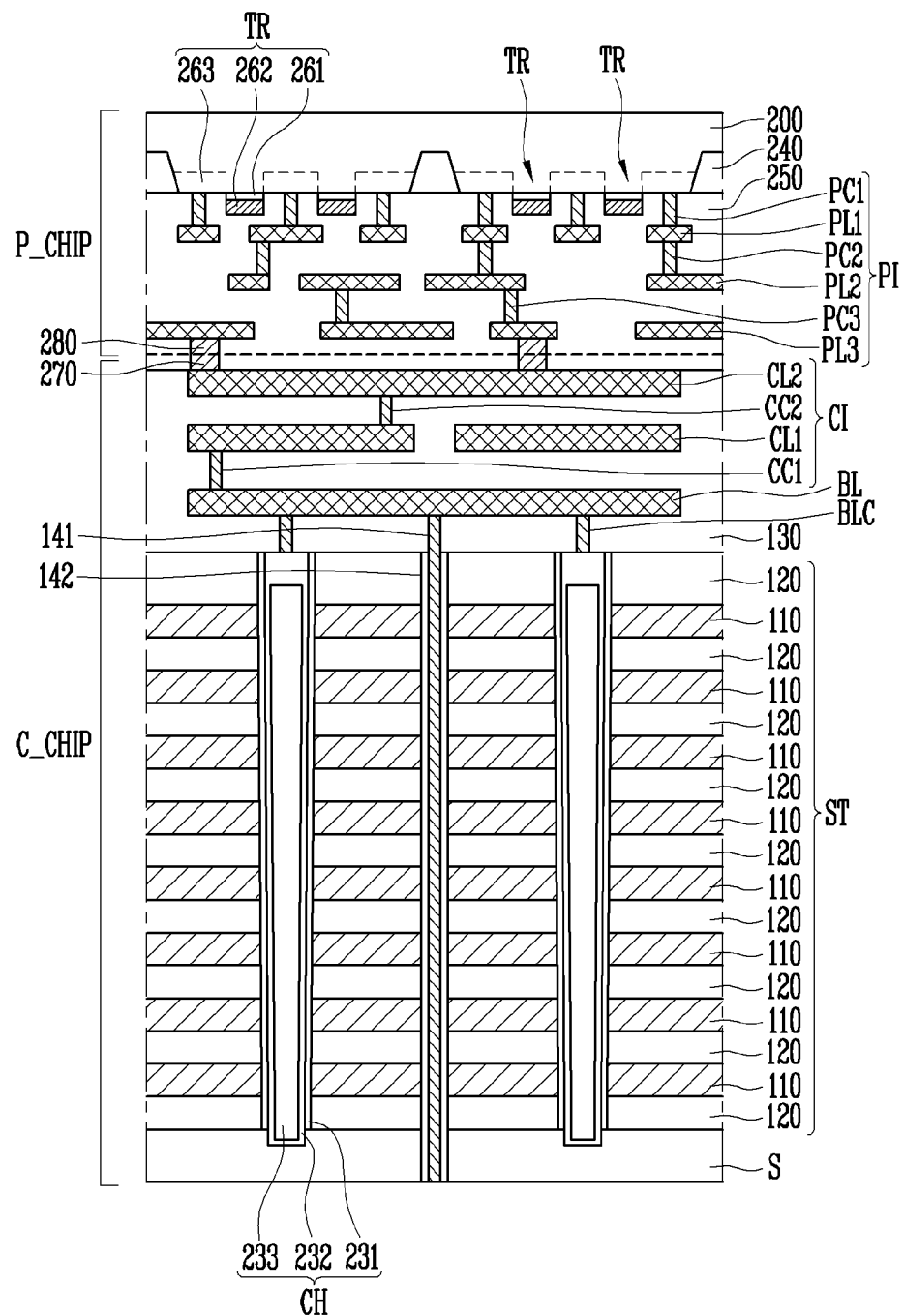
FIG. 10 is a cross-sectional view, illustrating the structure of the semiconductor device, according to an embodiment of the present disclosure.

FIG. 10 is a cross-sectional view illustrating the structure of the semiconductor device according to an embodiment of the present disclosure. Hereinafter, description repetitive to the above description will be omitted.

Referring to FIG. 10, the semiconductor device according to an embodiment may include a cell chip C_CHIP and a peripheral circuit chip P_CHIP bonded to the cell chip C_CHIP. The cell chip C_CHIP may be positioned on the peripheral circuit chip P_CHIP, or the peripheral circuit chip P_CHIP may be positioned on the cell chip C_CHIP.

The cell chip C_CHIP may include a source structure S, a stack ST, an interconnect structure CI, a first bonding structure 270, a channel structure CH, and a first interlayer insulating film 230. The source structure S may be a conductive film such as polysilicon or metal. Alternatively, the source structure S may be a substrate in which a source region including a P type or N type impurity is defined.

The stack ST may include conductive films 210 and insulating films 220 that are alternately stacked. The channel structure CH may include a channel film 232, a memory film 231, and a gap fill insulating film 233. The memory film 231 may include at least one of a tunnel insulating film, a data storage film, and a charge blocking film.

The interconnect structure CI may include contact plugs CC1 and CC2 and interconnect lines CL1 and CL2. The interconnect structure CI may be formed in the first interlayer insulating film 230.

The interconnect structure CI may have the structure according to the embodiments described above with reference to FIGS. 1 to 8F. For example, the contact plugs CC1 and CC2 may correspond to the first contact structures 44 or the first contact structures 54. In addition, the interconnect lines CL1 and CL2 may correspond to the plug-shaped second contact structures 45_P, the slit-shaped second contact structures 45_S, and the third contact structures 46, or may corresponds to the plug-shaped second contact structures 55_P, the slit-shaped second contact structures 55_S, and the third contact structures 56.

The first bonding structure 270 is for electrically connecting the cell chip C_CHIP and the peripheral circuit chip P_CHIP to each other. The first bonding structure 270 may have a shape of a contact plug, an interconnect line, or the like. The first bonding structures 270 may be electrically connected to the interconnect line CL2.

The peripheral circuit chip P_CHIP may include a substrate 200, a transistor TR, an interconnect structure PI, an element isolation film 240, a second bonding structure 280, and a second interlayer insulating film 250. The element isolation film 240 may be formed in the substrate 200, and an active region may be defined by the element isolation film 240. The transistor TR may include a gate insulating film 261, a gate electrode 262, and a junction 263.

The interconnect structure PI may include contact plugs PC1 to PC3 and interconnect lines PL1 to PL3. The interconnect structure PT may be formed in the second interlayer insulating film 250.

The interconnect structure PT may have the structure according to the embodiments described above with reference to FIGS. 1 to 8F, For example, the contact plugs PC1 to PC3 may correspond to the first contact structures 44, the first contact structures 54, or the first contact structures 84. In addition, the interconnect lines PL1 to PL3 may correspond to the plug-shaped second contact structures 45_P, the slit-shaped second contact structures 45_S, and the third contact structures 46, may correspond to the plug-shaped second contact structures 55_P, the slit-shaped second contact structures 55_S, and the third contact structures 56, or may correspond to the plug-shaped second contact structures 85_P, the slit-shaped second contact structures 85_S, and the third contact structures 86.

The second bonding structures 280 may be electrically connected to the interconnect lines PL3, The second bonding structures 280 may be in contact with the first bonding structures 270 of the cell chip C_CHIP. Therefore, the cell chip C_CHIP and the peripheral circuit chip P_CHIP may be electrically connected to each other through the first and second bonding structures 270 and 280. For example, the first bonding structures 270 and the second bonding structures 280 may be bonded to each other and the first interlayer insulating film 230 and the second interlayer insulating film 250 may be bonded to each other to connect the cell chip C_CHIP and the peripheral circuit chip P_CHIP to each other. Therefore, the stack ST is positioned between the substrate 200 and the source structure S.

Figure 11:
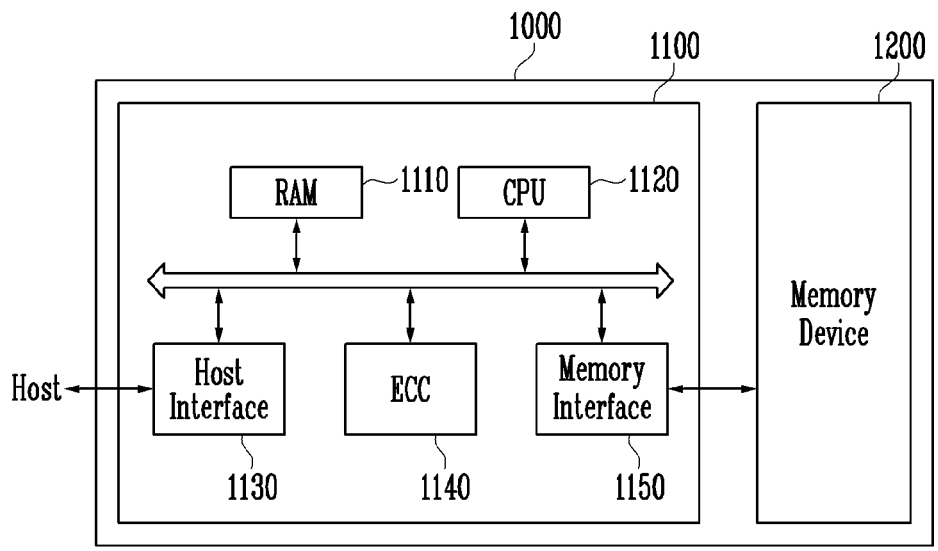
FIG. 11 is a block diagram, illustrating a configuration of a memory system, according to an embodiment of the present disclosure.

According to the structure described above, the cell chip C_CHIP and the peripheral circuit chip P_CHIP may be manufactured separately and may then be bonded together, FIG. 11 is a block diagram illustrating a configuration of a memory system according to an embodiment of the present disclosure.

Referring to FIG. 11, the memory system 1000 according to an embodiment of the present disclosure may include a memory device 1200 and a controller 1100.

The memory device 1200 is used to store data information having various data types such as a text, a graphic, and a software code. The memory device 1200 may be a non-volatile memory. In addition the memory device 1200 may have the structure described above with reference to FIGS. 1 to 10, and may be manufactured according to the manufacturing method described with reference to FIGS. 1 to 10. Since a structure of the memory device 1200 and a method of manufacturing the memory device 1200 are the same as described above, a detailed description thereof will be omitted.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 may include a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 may include a NAND interface or a NOR interface.

For reference, the controller 1100 may further include a buffer memory (not shown) for temporarily storing data, Here, the buffer memory may be used to temporarily store data transferred to the outside through the host interface 1130, or to temporarily store data transferred from the memory device 1200 through the memory interface 1150, In addition, the controller 1100 may further include a ROM that stores code data for interfacing with the host.

As described above, since the memory system 1000 according to an embodiment of the present disclosure may include the memory device 1200 having an improved degree of integration and an improved characteristic, a degree of integration and a characteristic of the memory system 1000 may also be improved.

Figure 12:
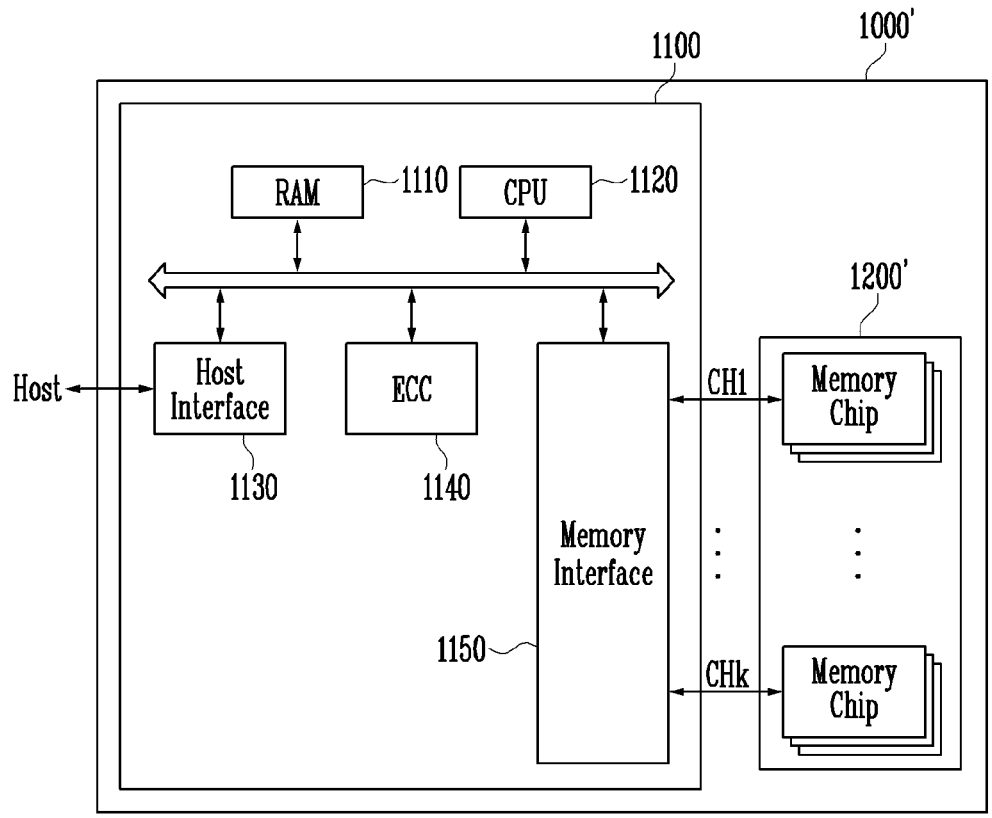
FIG. 12 is a block diagram, illustrating a configuration of a memory system, according to an embodiment of the present disclosure.

FIG. 12 is a block diagram illustrating a configuration of a memory system according to an embodiment of the present disclosure. Hereinafter, descriptions repetitive to the above description will be omitted.

Referring to FIG. 9, the memory system 1000' according to an embodiment of the present disclosure may include a memory device 1200' and a controller 1100. In addition, the controller 1100 may include a RAM 1110, a CPU 1120, a host interface 1130, an ECC circuit 1140, a memory interface 1150, and the like.

The memory device 1200' may be a non-volatile memory. The memory device 1200' may have the structure described above with reference to FIGS. 1 to 10, and may be manufactured according to the manufacturing method described with reference to FIGS. 1 to 10. Since a structure of the memory device 1200' and a method of manufacturing the memory device 1200' are the same as described above, a detailed description thereof will be omitted.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, since the memory system 1000' according to an embodiment of the present disclosure may include the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 13:
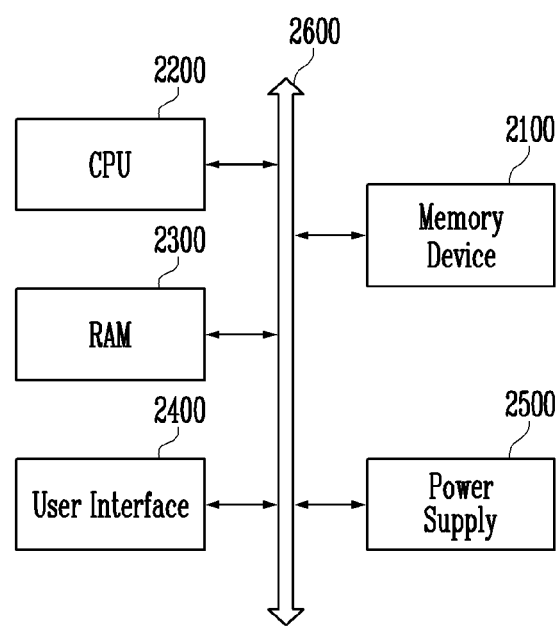
FIG. 13 is a block diagram, illustrating a configuration of a computing system, according to an embodiment of the present disclosure.

FIG. 13 is a block diagram illustrating a configuration of a computing system according to an embodiment of the present disclosure. Hereinafter, descriptions repetitive to the above description will be omitted.

Referring to FIG. 13, the computing system 2000 according to an embodiment of the present disclosure may include a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600, When the memory device 2100 is directly connected to the system bus 2600, a function of the controller may be performed by the CPU 2200, the RAM 2300, and the like.

Here, the memory device 2100 may be a non-volatile memory. The memory device 2100 may have the structure described above with reference to FIGS. 1 to 10, and may be manufactured according to the manufacturing method described with reference to FIGS. 1 to 10, Since a structure of the memory device 2100 and a method of manufacturing the memory device 2100 are the same as described above, a detailed description thereof will be omitted.

In addition, the memory device 2100 may be a multi-chip package including a plurality of memory chips as described with reference to FIG. 12.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or the like.

Figure 14:
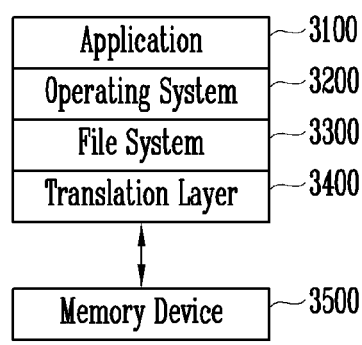
FIG. 14 is a block diagram, illustrating a computing system, according to an embodiment of the present disclosure.

As described above, since the computing system 2000 according to an embodiment of the present disclosure may include the memory device 2100 having an improved degree of integration and an improved characteristic, a characteristic of the computing system 2000 may also be improved, FIG. 14 is a block diagram illustrating a computing system according to an embodiment of the present disclosure.

Referring to FIG. 14, the computing system 3000 according to an embodiment of the present disclosure may include a software layer including an operating system 3200, an application 3100, a file system 3300, a translation layer 3400, and the like. In addition, the computing system 3000 may include a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is a Windows system of Microsoft company, the file system 3300 may be a file allocation table (FAT), an NT file system (NITS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. In addition, the memory device 3500 may have the structure described above with reference to FIGS. 1 to 10, and may be manufactured according to the manufacturing method described with reference to FIGS. 1 to 10. Since a structure of the memory device 3500 and a method of manufacturing the memory device 3500 are the same as described above, a detailed description thereof will be omitted.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, since the computing system 3000 according to an embodiment of the present disclosure may include the memory device 3500 having an improved degree of integration and an improved characteristic, a characteristic of the computing system 3000 may also be improved.

What is claimed is:
1. A method of manufacturing a semiconductor device, the method comprising:
   forming a transistor over a substrate;
   forming a plurality of first contact structures;
   forming plug-shaped second contact structures electrically connected to a first number of the plurality of first contact structures, respectively;
   forming a slit-shaped second contact structure to extend in a horizontal direction and directly connected to upper surfaces of first contact structures adjacent in the first direction, among the plurality of first contact structures, to electrically connect the first contact structures adjacent in the first direction to each other; and
   forming a third contact structure to be electrically connected to sidewalls of the plug-shaped second contact structures, adjacent in the first direction, wherein the plurality of first contact structures are connected to the transistor, and wherein the transistor includes a source region and a drain region, the source region is connected to the slit-shaped second contact structure through one of a second number of the plurality of first contact structures, and the drain region is connected to the third contact structure through one of a first number of the plurality of first contact structures and one of the plug-shaped second contact structures.

2. The method of claim 1,
wherein the transistor belongs to a page buffer.

3. The method of claim 1,
wherein the slit-shaped second contact structure is formed when forming the plug-shaped second contact structures.

4. The method of claim 1,
wherein the third contact structure is misaligned with the plurality of first contact structures, and the misaligned third contact structure and the plurality of first contact structures are connected to each other through the plug-shaped second contact structures.

5. The method of claim 1,
wherein the slit-shaped second contact structure and the third contact structure are adjacent to each other in a second direction crossing the first direction.

6. A method of manufacturing a semiconductor device, the method comprising:
forming a first interlayer insulating film;
forming a plurality of first contact structures to pass through the first interlayer insulating film;
forming an etch stop film on the first interlayer insulating film;
forming a second interlayer insulating film on the etch stop film;
forming plug-shaped second contact structures to pass through the etch stop film and the second interlayer insulating film and electrically connected to a first number of the plurality of first contact structures, respectively;
forming a slit-shaped second contact structure to pass through the etch stop film and the second interlayer insulating film, to be electrically connected to second number of the plurality of first contact structures, and to extend in a first direction; and
forming a third contact structure to pass through the second interlayer insulating film, to be electrically connected to sidewalls of the plug-shaped second contact structures, and to extend in the first direction.

7. The method of claim 6,
wherein the slit-shaped second contact structure is formed when forming the plug-shaped second contact structures.

8. The method of claim 6, further comprising:
forming a cell array including a source line, bit lines, and memory strings connected between the source line and the bit lines; and
forming a page buffer including a transistor, wherein the bit lines and the page buffer are connected to each other by an interconnect structure including the plurality of first contact structures, the plug-shaped second contact structures, the slit-shaped second contact structure, and the third contact structure.

9. The method of claim 8,
wherein the transistor includes a source region and a drain region, and the source region or the drain region is connected to the bit line through one of the second number of the plurality of first contact structures and the slit-shaped second contact structure.

10. The method of claim 8,
wherein the transistor includes a source region and a drain region, and the source region or the drain region is connected to the bit line through one of the first number of the plurality of first contact structures, one of the plug-shaped second contact structures, and the third contact structure.

11. The method of claim 6, wherein forming the plurality of first contact structures comprises:
etching the first interlayer insulating film to form first openings; and
forming the plurality of first contact structures in the first openings.

12. The method of claim 6, wherein forming the plug-shaped second contact structures comprises:
etching the second interlayer insulating film to expose the etch stop film;
etching the exposed etch stop film to form second openings exposing the plurality of first contact structures, respectively; and
forming the plug-shaped second contact structures in the second openings, respectively.

13. The method of claim 6, wherein forming the slit-shaped second contact structure comprises:
etching the second interlayer insulating film to expose the etch stop film;
etching the exposed etch stop film to form a third opening exposing the plug-shaped second contact structures adjacent in the first direction; and
forming the slit-shaped second contact structure in the third opening.

14. The method of claim 6, wherein forming the third contact structure comprises:
etching the second interlayer insulating film to form a fourth opening exposing sidewalls of the plug-shaped second contact structures adjacent in the first direction; and
forming a third contact structure in the fourth opening.

15. The method of claim 6,
wherein the slit-shaped second contact structure and the third contact structure are adjacent to each other in a second direction crossing the first direction.

* * * * *